(12) United States Patent
Jin et al.

(10) Patent No.: US 10,438,039 B2
(45) Date of Patent: Oct. 8, 2019

(54) GLASS-BASED SUBSTRATE WITH VIAS AND PROCESS OF FORMING THE SAME

(71) Applicant: CORNING INCORPORATED, Corning, NY (US)

(72) Inventors: Yuhui Jin, Painted Post, NY (US); Matthew Evan Wilhelm, New Haven, CT (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/131,247

(22) Filed: Sep. 14, 2018

(65) Prior Publication Data

US 2019/0012514 A1 Jan. 10, 2019

Related U.S. Application Data

(62) Division of application No. 15/286,803, filed on Oct. 6, 2016, now abandoned.
(Continued)

(51) Int. Cl.
*C03C 15/00* (2006.01)
*G06K 9/00* (2006.01)
(Continued)

(52) U.S. Cl.
CPC ...... *G06K 9/00013* (2013.01); *B23K 26/0006* (2013.01); *B23K 26/382* (2015.10);
(Continued)

(58) Field of Classification Search
CPC .................................................. C03C 15/00
(Continued)

(56) References Cited

U.S. PATENT DOCUMENTS 5,166,493 A 11/1992 Inagawa et al.
6,794,605 B2 9/2004 Park et al.
(Continued)

FOREIGN PATENT DOCUMENTS

WO 2005034594 A1 4/2005
WO 14205301 12/2014

OTHER PUBLICATIONS

International Search Report and Written Opinion PCT/US2016/056042 dated Mar. 23, 2017.
(Continued)

*Primary Examiner* — Roberts P Culbert
(74) *Attorney, Agent, or Firm* — John P. McGroarty (57) ABSTRACT

A glass sensor substrate including metallizable through vias and related process is provided. The glass substrate has a first major surface, a second major surface and an average thickness of greater than 0.3 mm. A plurality of etch paths are created through the glass substrate by directing a laser at the substrate in a predetermined pattern. A plurality of through vias through the glass substrate are etched along the etch paths using a hydroxide based etching material. The hydroxide based etching material highly preferentially etches the substrate along the etch path. Each of the plurality of through vias is long compared to their diameter for example such that a ratio of the thickness of the glass substrate to a maximum diameter of each of the through vias is greater than 8 to 1.

15 Claims, 6 Drawing Sheets

Related U.S. Application Data (60) Provisional application No. 62/239,528, filed on Oct. 9, 2015.

(51) Int. Cl.

| | | |
|---|---|---|
| *C03B 33/02* | (2006.01) | |
| *B23K 26/53* | (2014.01) | |
| *B23K 26/00* | (2014.01) | |
| *C03C 23/00* | (2006.01) | |
| *H05K 1/03* | (2006.01) | |
| *H05K 1/11* | (2006.01) | |
| *H05K 3/00* | (2006.01) | |
| *H05K 3/22* | (2006.01) | |
| *H05K 3/40* | (2006.01) | |
| *H05K 5/00* | (2006.01) | |
| *C03C 17/36* | (2006.01) | |
| *C03C 21/00* | (2006.01) | |
| *B23K 26/382* | (2014.01) | |
| *B23K 26/386* | (2014.01) | |
| *B23K 26/402* | (2014.01) | |
| *B23K 101/42* | (2006.01) | |
| *B23K 103/00* | (2006.01) | |

(52) U.S. Cl.
CPC .......... *B23K 26/386* (2013.01); *B23K 26/389* (2015.10); *B23K 26/402* (2013.01); *B23K 26/53* (2015.10); *C03B 33/0222* (2013.01); *C03C 15/00* (2013.01); *C03C 17/36* (2013.01); *C03C 17/3649* (2013.01); *C03C 17/3668* (2013.01); *C03C 21/002* (2013.01); *C03C 23/0025* (2013.01); *H05K 1/0306* (2013.01); *H05K 1/115* (2013.01); *H05K 3/002* (2013.01); *H05K 3/0029* (2013.01); *H05K 3/22* (2013.01); *H05K 3/4038* (2013.01); *H05K 5/0017* (2013.01); *B23K 2101/42* (2018.08); *B23K 2103/54* (2018.08); *H05K 2201/09509* (2013.01); *H05K 2201/10151* (2013.01)

(58) Field of Classification Search
USPC .......................................................... 216/97
See application file for complete search history.

(56) References Cited

U.S. PATENT DOCUMENTS

| | | |
|---|---|---|
| 9,832,868 B1 | 11/2017 | Wright et al. |
| 2005/0142364 A1 | 6/2005 | Aitken |
| 2006/0270232 A1 | 11/2006 | Kawamura et al. |
| 2006/0290232 A1 | 12/2006 | Fujita et al. |
| 2009/0098351 A1* | 4/2009 | Kishi ................. C03C 15/00 428/210 |
| 2012/0048604 A1 | 3/2012 | Cornejo et al. |
| 2012/0111057 A1 | 5/2012 | Barefoot et al. |
| 2012/0125892 A1 | 5/2012 | Shimoi et al. |
| 2012/0129359 A1 | 5/2012 | Shimoi et al. |
| 2012/0135608 A1 | 5/2012 | Shimoi et al. |
| 2013/0034688 A1 | 2/2013 | Koike et al. |
| 2013/0089701 A1 | 4/2013 | Hooper et al. |
| 2013/0247615 A1 | 9/2013 | Boek et al. |
| 2014/0147623 A1 | 5/2014 | Shorey et al. |
| 2014/0147624 A1 | 5/2014 | Streltsov et al. |
| 2015/0060402 A1 | 3/2015 | Burkett et al. |
| 2015/0166395 A1 | 6/2015 | Marjanovic et al. |
| 2016/0026842 A1 | 1/2016 | Withers et al. |

OTHER PUBLICATIONS

Kiyama, S., et al. (2009). "Examination of Etching Agent and Etching Mechanism on Femtosecond Laser Microfabrication of Channels Inside Vitreous Silica Substrates†." The Journal of Physical Chemistry C 113(27): 11560-11566.
ASTM standard C770-16, entitled "Standard Test Method for Measurement of Glass Stress-Optical Coefficient," downloaded Jan. 4, 2017.
International Searching Authority Invitation to Pay Additional Search Fees PCT/US2016/056042 dated Feb. 1, 2017.
EP16790775.7 Office Action dated May 10, 2019, European Patent Office, 9 Pgs.

* cited by examiner

GLASS-BASED SUBSTRATE WITH VIAS AND PROCESS OF FORMING THE SAME

This application is a divisional of U.S. application Ser. No. 15/286,803, filed Oct. 6, 2016, claims the benefit of priority under 35 U.S.C. § 119 of U.S. Provisional Application Ser. No. 62/239,528, filed on Oct. 9, 2015, the content of which is relied upon and incorporated herein by reference in its entirety.

BACKGROUND

The disclosure relates generally to glass-based substrate materials, and specifically to glass-based substrate materials having through holes of sufficient size to allow for metallization as may be used in a sensor arrangement, such as a fingerprint sensor on a portable electronic device. Finger print sensors have seen increased use in portable electronic devices, such as smart phones. Such sensors typically use a substrate layer supporting conductive layers that connect a sensing device (e.g., a capacitance sensor) to a processing circuit (e.g., a fingerprint application specific integrated circuit (ASIC)) configured to receive and process the sensing signal from the sensing device.

SUMMARY

One embodiment of the disclosure relates to a process for forming a glass sensor substrate including metallizable through vias. The process includes providing a glass substrate, and the glass substrate has a first major surface, a second major surface opposing the first major surface and an average thickness of greater than 0.3 mm. The process includes creating a plurality of etch paths through the glass substrate by directing a laser at the substrate in a predetermined pattern. The process includes etching a plurality of through vias through the glass substrate along the etch paths using a hydroxide based etching material. The hydroxide based etching material preferentially etches the substrate along the etch path such that an etch rate of the etching material along the etch path is at least 12 times greater than an etch rate of the etching material outside of the etch paths. Each of the plurality of through vias are long compared to their diameter such that a ratio of the thickness of the glass substrate to a maximum diameter of each of the through vias is greater than 8 to 1.

An additional embodiment of the disclosure relates to a glass sensor substrate configured to support a sensing element and electrically conductive material that couples the sensing element to a processing circuit. The glass sensor substrate includes a first major surface and a second major surface opposite the first major surface. The glass sensor substrate includes an interior region located between the first and second major surfaces. The glass sensor substrate includes a plurality of chemically etched through holes extending between the first and second major surfaces through the interior region. Each of the through holes has a maximum diameter and a minimum diameter, and the substrate has an average thickness of greater than 0.3 mm. The maximum diameter of each of the plurality of through holes is less than 100 μm. The through holes do not substantially narrow along their lengths such that a ratio of the minimum diameter to the maximum diameter of each of the through holes is greater than 0.5 such that the electrically conductive material is permitted to fill the through holes providing a conductive path between the first major surface and the second major surface.

An additional embodiment of the disclosure relates to a glass substrate. The glass substrate includes a first major surface and a second major surface opposite the first major surface. The glass substrate includes a plurality of through holes extending between the first and second major surfaces, and each of the through holes has a maximum diameter and a minimum diameter. The glass substrate is a multicomponent glass material including 50-75% $SiO_2$ and 10-20% alkali metal oxide, where the alkali metal oxide is at least one of $Li_2O$, $Na_2O$, $K_2O$, $Rb_2O$ and $Cs_2O$. The average distance between the first major surface and the second major surface is greater than 0.3 mm. A ratio of the average distance between the first major surface and the second major surface to a maximum diameter of each of the plurality of through holes is greater than 8 to 1. A ratio of the minimum diameter to the maximum diameter of each of the through holes is greater than 0.5.

Additional features and advantages will be set forth in the detailed description that follows, and, in part, will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding and are incorporated in and constitute a part of this specification. The drawings illustrate one or more embodiment(s), and together with the description serve to explain principles and the operation of the various embodiments.

DETAILED DESCRIPTION

As used herein, the term "glass-based" means both glasses and glass-ceramics.

As used herein, the term "through via" means a via that extends through a thickness of a substrate from a first surface to a second surface.

As used herein, the term "blind via" means a via that extends only partially through a thickness of a substrate from one of first surface or second surface but not to all the way to the other of first surface or second surface.

Referring generally to the figures, a glass-based substrate with vias and a related process for forming the glass substrate with vias are shown and described. The glass-based substrate may be used in an application where a substrate with vias may be leveraged, including, but not limited to sensors, for example a fingerprint sensor; semiconductor devices; radio-frequency (RF) devices, such as antennae, switches, and the like; interposer devices; microelectronic devices; optoelectronic devices; and microelectronic mechanical system (MEMS) devices. Described herein are processes that allow high aspect ratio (e.g., high length to width/diameter ratio) vias to be formed in relatively thick glass substrate materials (e.g., having a thickness greater than 0.3 mm) via a hydroxide based etching process. The glass-based substrate discussed herein is relatively thick and capable of being strengthened (e.g., chemically tempered, heat tempered, etc.) which provides a robust, strong and drop resistant substrate. The high aspect ratio vias discussed herein are sufficiently wide and/or have highly consistent widths along their lengths to allow for filling the vias with an electrically conductive material, for example, metallization, which allows the relatively thick and robust substrate discussed herein to be used in sensing applications and allows for relatively high signal to noise ratios. As will be understood, for at least some sensor types, metallized through holes are utilized to allow sufficient sensor signal to be communicated from the sensing device through the substrate and to a processing circuit associated with the sensor.

In some embodiments, the process starts with directing a laser (such as a picosecond laser) to a plurality of positions on the substrate. The laser interacts with the substrate to form a plurality of etch paths or damage paths through the substrate. The laser interaction with the substrate is believed to differentially change the structure and/or chemistry of the substrate along the path of the laser, as compared to adjacent sections of the substrate that did not interact with the laser. An exemplary process for forming the etch paths/damage paths is described in U.S. Pub. No. 2015/0166395, which is hereby incorporated by reference in its entirety. In some embodiments, a variety of hydroxide based etchants preferentially etch the substrate along the laser damage tracks at a highly preferential etch rate. This highly preferential etching forms long, relatively wide holes/vias with a highly consistent width/diameter along the length of the hole (e.g., the hole has a low degree of taper, does not significant constrict toward its center, etc.), which allows for metallization, through favorable, low-cost processes such as metallization through metal paste application. It is believed that minimum hole diameter to maximum hole diameter differentials as low as 5 μm can be achieved using the process discussed herein. In comparison, minimum hole diameter to maximum hole diameter differentials achieved using conventional hydrofluoric acid based etching can be as much as 35 μm.

In addition, the hydroxide based etchants discussed herein are also capable of etching at high absolute etch rates such that through holes of a desired diameter may be formed in relatively low etch times. Further, the hydroxide based etching process discussed herein provides a process that is relatively safe, as compared to conventional hydrofluoric acid based etching techniques, because the hydroxide based etchants tend to be less toxic, less volatile and less caustic than hydrofluoric acid. In various embodiments, the process discussed herein also provides improved etch performance as discussed herein while also utilizing a less complex and a less expensive etching system compared to conventional hydrofluoric acid etching systems. For example, in at least some embodiments, the hydroxide based etching system discussed herein does not utilize ultrasonic or mechanical agitation/vibration to achieve preferential etch rates.

Figure 1:
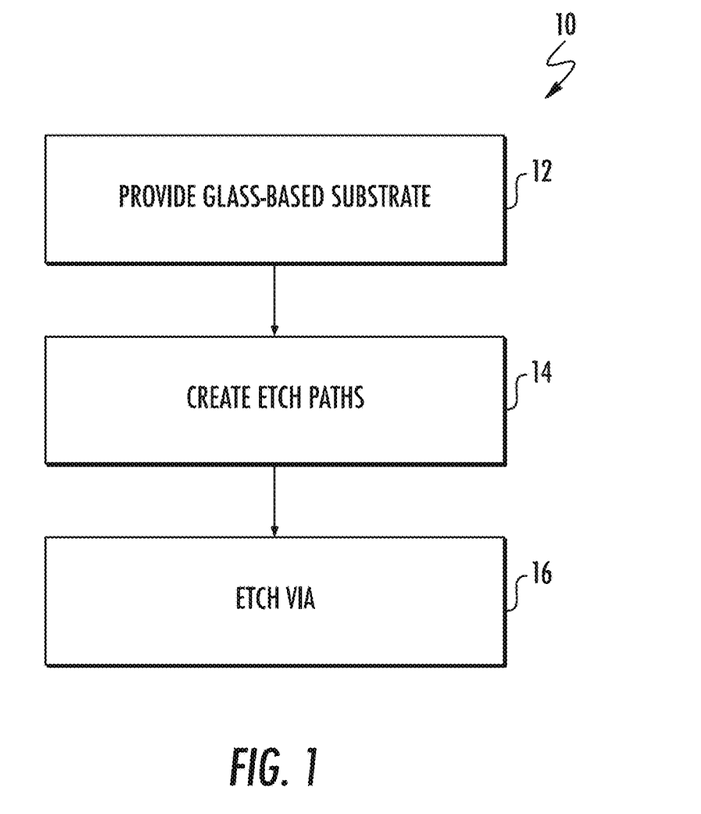
FIG. 1 shows a diagram of a process for forming a glass-based substrate according to an exemplary embodiment.

Referring to FIG. 1, a flow chart showing a process of forming a glass-based substrate, shown as process 10, is shown according to an exemplary embodiment. At step 12, a glass-based substrate, such as a glass-based sheet or a glass-based wafer, is provided. At step 14, a plurality of etch paths through the glass-based substrate is formed by directing a laser at the substrate in a predetermined pattern. At step 16 a plurality of vias through the glass-based substrate is formed by etching along the etch paths using a hydroxide based etching material. In some embodiments, the vias are all through vias; in other embodiments, the vias are all blind vias; and in still other embodiments, the vias are a combination of blind and through vias.

Figure 2:
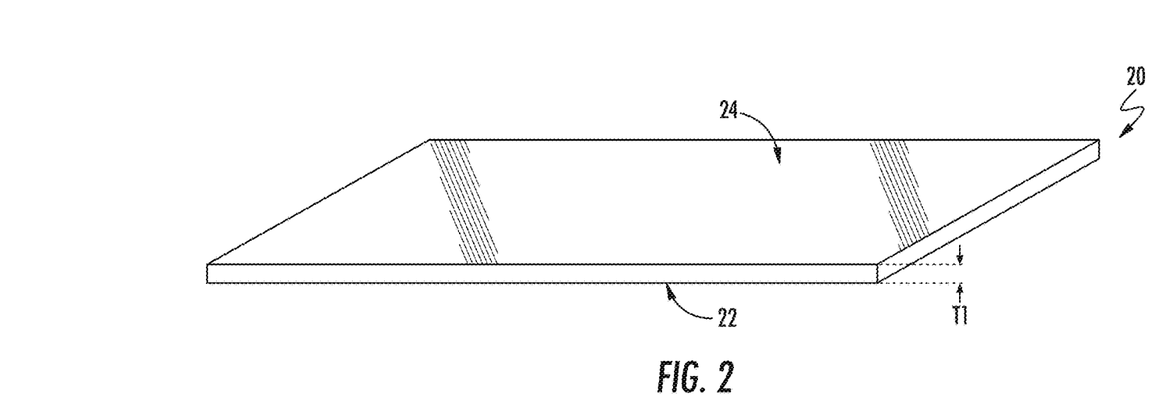
FIG. 2 is a perspective view of a substrate according to an exemplary embodiment.

Referring to FIG. 2, a detailed view of a glass-based substrate as provided at step 12 is shown according to an exemplary embodiment. FIG. 2 shows a glass-based substrate, shown as glass-based substrate 20. Glass-based substrate 20 includes a first major surface, shown as lower surface 22, a second major surface, shown as upper surface 24. Glass substrate 20 has a thickness, such as an average thickness, shown as T1. In various embodiments, T1 is greater than 0.3 mm, and more specifically greater than 0.5 mm. In more specific embodiments, T1 is greater than 0.3 mm and less than 1.1 mm, and specifically greater than 0.5 mm and less than 1.1 mm. In a specific exemplary embodiment, T1 is 0.7 mm. The average thickness is determined by measuring the thickness of the glass-based substrate at at least three points with an interferometer and averaging the measurements.

In various embodiments, glass-based substrate 20 may be formed from any glass or glass-ceramic material suitable for through hole formation via etching. In some embodiments, the substrate can be glass and the glass can include fused silica, alkali containing glass (for example alkalialuminosilicate glasses), alkali-free glass (for example an alkali-free alkaline aluminoborosilicate glass), or laminated glass pieces with layers containing different glass compositions. In a specific embodiment, glass substrate 20 is a multicomponent glass material. In various embodiments, glass substrate 20 is a multicomponent glass material including 50-75 mol % $SiO_2$ and 10-20 mol % alkali metal oxide, where the alkali metal oxide is at least one of $Li_2O$, $Na_2O$, $K_2O$, $Rb_2O$ and $Cs_2O$. In various embodiments, such multicomponent glass is capable of being tempered through ion-exchange processes, as discussed in more detail below. In some exemplary embodiments, glass substrate 20 may be any of the strengthened glass materials described in US Published Patent Application No. 2012/0111057, which is incorporated herein by reference in its entirety. In some exemplary embodiments, glass substrate 20 may be any of the strengthened glass materials described in US Published Patent Application No. 2005/0142364, which is incorporated herein by reference in its entirety.

In various embodiments, glass-based substrate 20 described herein may comprise numerous compositions. In one embodiment, glass-based substrate 20 comprises an alkali aluminosilicate glass. In some embodiments, the alkali aluminosilicate glass comprises, consists essentially of, or consists of: 60-70 mol % $SiO_2$; 6-14 mol % $Al_2O_3$; 0-15 mol % $B_2O_3$; 0-15 mol % $Li_2O$; 0-20 mol % $Na_2O$; 0-10 mol % $K_2O$; 0-8 mol % MgO; 0-10 mol % CaO; 0-5 mol % $ZrO_2$; 0-1 mol % $SnO_2$; 0-1 mol % $CeO_2$; less than 50 ppm $As_2O_3$;

and less than 50 ppm $Sb_2O_3$; wherein 12 mol %≤$Li_2O$+$Na_2O$+$K_2O$≤20 mol % and 0 mol %≤$MgO$+$CaO$≤10 mol %. In other embodiments, the alkali aluminosilicate glass comprises, consists essentially of, or consists of 64 mol %≤$SiO_2$≤68 mol %; 12 mol %≤$Na_2O$≤16 mol %; 8 mol %≤$Al_2O_3$≤12 mol %; 0 mol %≤$B_2O_3$≤3 mol %; 2 mol %≤$K_2O$≤5 mol %; 4 mol %≤$MgO$≤6 mol %; and 0 mol %≤$CaO$≤5 mol %, wherein: 66 mol %≤$SiO_2$+$B_2O_3$+$CaO$≤69 mol %; $Na_2O$+$K_2O$+$B_2O_3$+$MgO$+$CaO$+$SrO$>10 mol %; 5 mol %≤$MgO$+$CaO$+$SrO$≤8 mol %; ($Na_2O$+$B_2O_3$)—$Al_2O_3$≤2 mol %; 2 mol %≤$Na_2O$—$Al_2O_3$≤6 mol %; and 4 mol %≤($Na_2O$+$K_2O$)—$Al_2O_3$≤10 mol %. In yet other embodiments, the alkali aluminosilicate glass comprises, consists essentially of, or consists of: 5-50 wt % $SiO_2$; 2-20 wt % $Al_2O_3$; 0-15 wt % $B_2O_3$, 1-20 wt % $Na_2O$; 0-10 wt % $Li_2O$; 0-10 wt % $K_2O$; and 0-5 wt % (Mg)+$CaO$+$SrO$+$BaO$); 0-3 wt % ($SrO$+$BaO$); and 0-5 wt % ($ZrO_2$+$TiO_2$), wherein 0≤($Li_2O$+$K_2O$)/$Na_2O$≤0.5.

In other embodiments, glass-based substrate 20 is formed from a glass composition comprising the following composition when calculated in mol percent and calculated from the batch on an oxide basis: 55-80 $SiO_2$, 12-30 $Al_2O_3$, and 2-15 $P_2O_5$. In some embodiments, glass-based substrate 20 is formed from a glass composition comprising a modifying oxide. In some embodiments, at least one modifying oxide is selected from the group consisting of $Y_2O_3$, $ZrO_2$, $HfO_2$, MgO, CaO, SrO, BaO, $As_2O_3$, $SnO_2$, $Li_2O$, $La_2O_3$ $GeO_2$, $Ga_2O_3$, $Sb_2O_3$, $Na_2O$, $K_2O$, $K_2O$, $Rb_2O$, $Cs_2O$, BeO, $Sc_2O_3$, $TiO_2$, $Nb_2O_5$, $Ta_2O_5$, ZnO, CdO, PbO, $Bi_2O_3$, $Gd_2O_3$ $Lu_2O_3$ and/or $B_2O_3$ in a total amount not exceeding 15 mol %. In other embodiments, the at least one modifying oxide is selected from the group consisting of $Y_2O_3$, $ZrO_2$, $HfO_2$, MgO, CaO, SrO, BaO, $As_2O_3$, $SnO_2$, $Li_2O$, $La_2O_3$ $GeO_2$, $Ga_2O_3$, $Sb_2O_3$, $Na_2O$, $K_2O$, $Rb_2O$, $Cs_2O$, BeO, $Sc_2O_3$, $TiO_2$, $Nb_2O_5$, $Ta_2O_5$, ZnO, CdO, PbO, $Bi_2O_3$, $Gd_2O_3$, $Lu_2O_3$ and/or $B_2O_3$ in a total amount not exceeding 7 mol %.

In various embodiments, substrate 20 has a width or diameter (e.g., the width or diameter of surface 22 and/or 24) of a size sufficient for use as a sensor substrate. In various embodiments, the width or diameter (in the case of a circular wafer) of substrate 20 is between 25 mm and 500 mm, specifically between 50 mm and 300 mm and more specifically between 100 mm and 200 mm. In an exemplary embodiment, substrate 20 is a disc having a diameter of about 150 mm and a thickness of about 0.7 mm.

Figure 3:
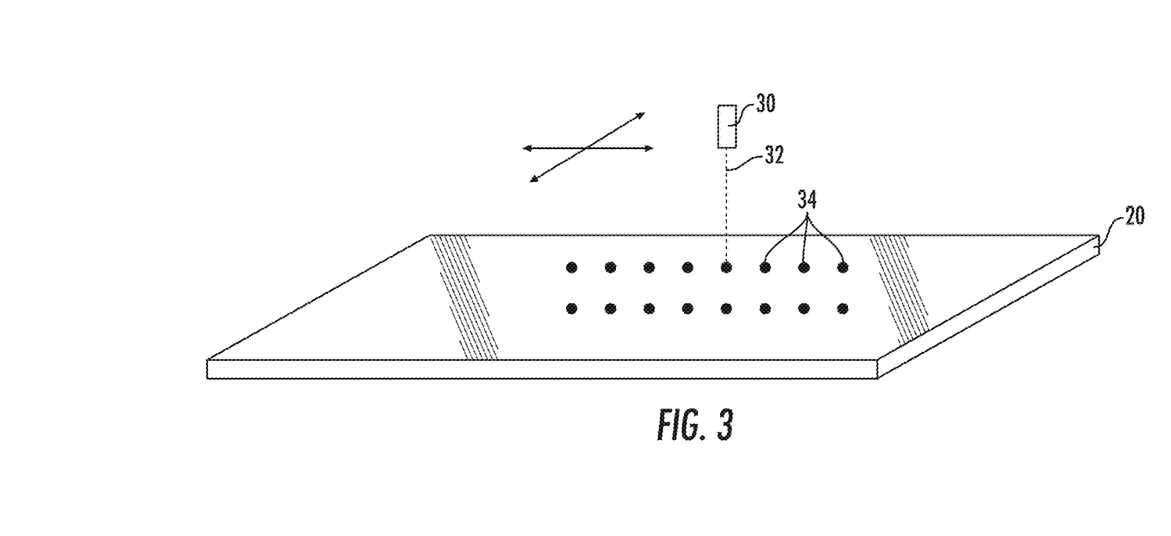
FIG. 3 is a schematic representation showing formation of laser damage tracks on a substrate according to an exemplary embodiment.

Referring to FIG. 3, a schematic view of the creation of etch paths at step 14 is shown according to an exemplary embodiment. As shown in FIG. 3, a laser device 30 is moved, aimed or otherwise controlled to direct laser 32 in a predetermined pattern onto substrate 20. Laser 32 interacts with the material of substrate 20 and is believed to form physical or chemical changes through substrate 20 at the path of laser interaction forming a plurality of etch paths, shown as laser damage tracks 34. Damage tracks 34 extend through a portion or an entirety of substrate 20 at the path of transmission of laser 32, and as discussed in more detail below, damage tracks 34 provide the site for the preferential etching of substrate 20 to form vias (blind and/or through vias) in substrate 20. In some embodiments, the pattern of damage tracks 34 (and consequently, the location of through vias following etching) is selected based on the configuration of the particular sensor components and processing circuit for the sensor that substrate 20 will be used with.

In various embodiments, damage tracks 34 have a diameter or width that is relatively small compared to the eventual size of the vias following etching. In various embodiments, damage tracks 34 have a diameter between 0.05 μm and 1 μm and specifically about 0.3 μm (e.g., 0.3 μm plus or minus 10%).

In various embodiments, laser 32 may be a wide variety of lasers suitable for forming damage tracks 34. In various embodiments, one or more parameter (e.g., power, wavelength, timing, etc.) of laser 32 is selected or controlled to form damage tracks 34 based on one or more characteristic of substrate 20, such as thickness or glass type, and/or based on the particular type of etchant used to form through vias in step 16. In specific embodiments, laser 32 is a picosecond line-focused laser, and specifically is a picosecond line-focused laser having a laser wavelength of 1064 nm.

Figure 4:
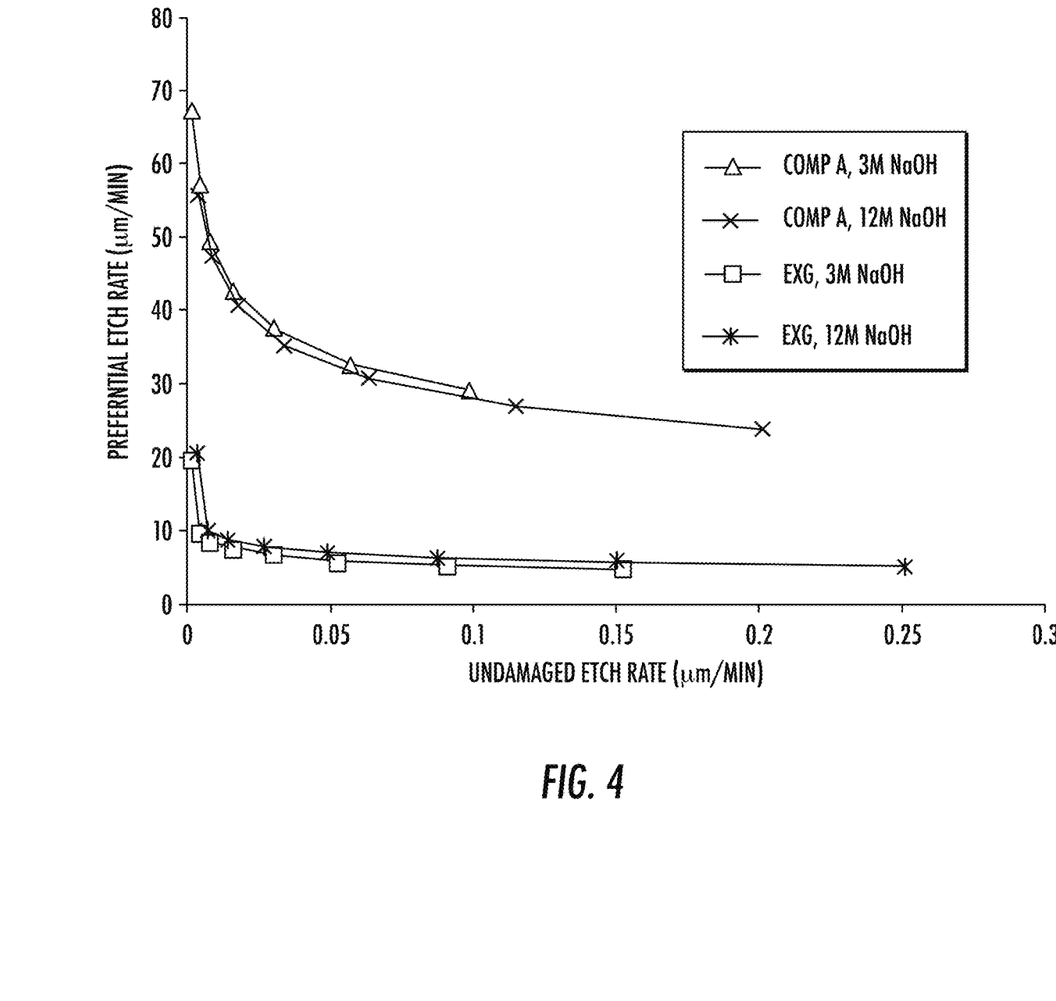
FIG. 4 is a plot showing etch rates vs. preferential etch rates for two substrate material types and two etching materials.

Referring to FIG. 1 and FIG. 4, the etching step 16 is shown and described. In general, substrate 20 is placed into an etchant bath following formation of damage tracks 34. In various embodiments, the etching material is a hydroxide etching material that preferentially etches substrate 20 at the site of damage tracks 34 as compared to areas outside of damage tracks 34. In such embodiments, as shown in FIG. 4, various hydroxide based etching materials have a high preferential etch rate. As used herein, "preferential etch rate" refers to the etch rate of the glass-based material at the site of the damage tracks 34. As used herein, "undamaged etch rate" refers to the etch rate of the glass-based material that was not subjected to the laser damage (e.g., the areas of the glass-based material not at the side of a damage track/etch path).

For example, in some such embodiments, the hydroxide based etching materials discussed herein have a preferential etch rate at which the etching material removes material from the substrate) along damage tracks 34 that is at least 12 times greater than the undamaged etch rate experienced by portions of the substrate outside of damage tracks 34. In some embodiments, the hydroxide based etching materials discussed herein have a preferential etch rate along the damage tracks 34 that is at between 30 and 70 times greater that the undamaged etch rate experienced by portions of the substrate outside of damage tracks 34. As will be understood, the high preferential etch rate discussed herein allows for the formation of vias in relatively thick substrate 20 and also allows for the formation of through vias that do not narrow substantially at the midpoint through substrate 20. As will be understood, the high preferential etch rate allows for the fast formation of vias in substrate 20 without the unnecessary removal of undue amounts of substrate material from areas outside of damage tracks 34.

In addition to exhibiting high preferential etch rates, the hydroxide etching materials discussed herein also have a relatively high undamaged etch rate. In various embodiments, the hydroxide based etching materials discussed herein have undamaged etch rates outside the area of damage tracks 34 between 0.02 μm/min and 0.25 μm/min.

In various embodiments, the hydroxide based etching material may be any hydroxide material. In particular embodiments, the hydroxide based etching material is at least one of sodium hydroxide, potassium hydroxide and tetramethylammonium hydroxide, and in specific embodiments, these materials are formed in an aqueous mixture with at least one of a diol and an alcohol. In various embodiments, the etching material has a hydroxide concentration of at least 0.5 M. In various embodiments, the etching material may be sodium hydroxide or potassium hydroxide having a concentration between 1 M and 19.5 M. In specific embodiments, the etching material is maintained at a temperature of greater than 60 degrees C. during etching, specifically between 60 and 175 degrees C. during etching, and more specifically between 60 and 120 degrees C. during etching.

In various embodiments, it is believed that due to the high preferential etch rates and high undamaged etch rates achievable with the process discussed herein, the process of the present disclosure forms a high aspect ratio through vias through a relatively thick substrate while maintaining total processing time at a satisfactorily low level. In various embodiments, the total etching time of the process discussed herein is less than 24 hours, specifically less than 20 hours and in at least some embodiments, less than 10 hours. In one exemplary embodiment, it has been demonstrated that through vias can be formed through substrate 20 in as little as 3 hours using the process discussed herein without the need for mechanical agitation or sonication. In various embodiments, total etching time of the process discussed herein is between two weeks and 3 hours, and in a specific embodiment, total etching time of the process discussed herein is four days.

By way of example, FIG. 4 shows plots of undamaged etch rate in μm/min versus preferential etch rate in μm/min for two etching materials and two different substrate materials. In an exemplary embodiment, material Comp A represents a composition having the following on an oxide basis: 69.11 mol % $SiO_2$; 10.19 mol % $Al_2O_3$; 15.09 mol % $Na_2O$; 0.01 mol % $K_2O$; 5.48 mol % $MgO$; 0.005 mol % $TiO_2$; 0.01 mol % $Fe_2O_3$; 0.01 mol % $ZrO_2$; and 0.13 mol % $SnO_2$, and material code EXG represents Corning® Eagle XG® Glass. As shown in FIG. 4, both substrate materials were etched at different etch rates using a 3 M NaOH etching material and a 12 M NaOH etching material. FIG. 4 shows that generally in the process of the present application, as undamaged etch rates decrease preferential etch rates increase, as shown by the curves in FIG. 4.

In an alternative embodiment, process 10 may include two etching steps. The first etching step is a hydroxide based etching step, such as step 16 discussed above. In this embodiment during the first etching step, a low etch rate is used providing a very high preferential etch rate, as shown by the relationship between undamaged etch rate and preferential etch rate in FIG. 4. This first high preferential etch rate step is utilized to open up through holes along damage tracks 34. Then the undamaged etch rate is increased to quickly expand the through hole to the desired diameter. In various embodiments, the undamaged etch rate during the second etching step is increased by increasing hydroxide etchant concentration and/or temperature. In yet another embodiment, the second etching step may utilize an etchant with a higher etch rate, such as hydrofluoric acid.

Figure 5:
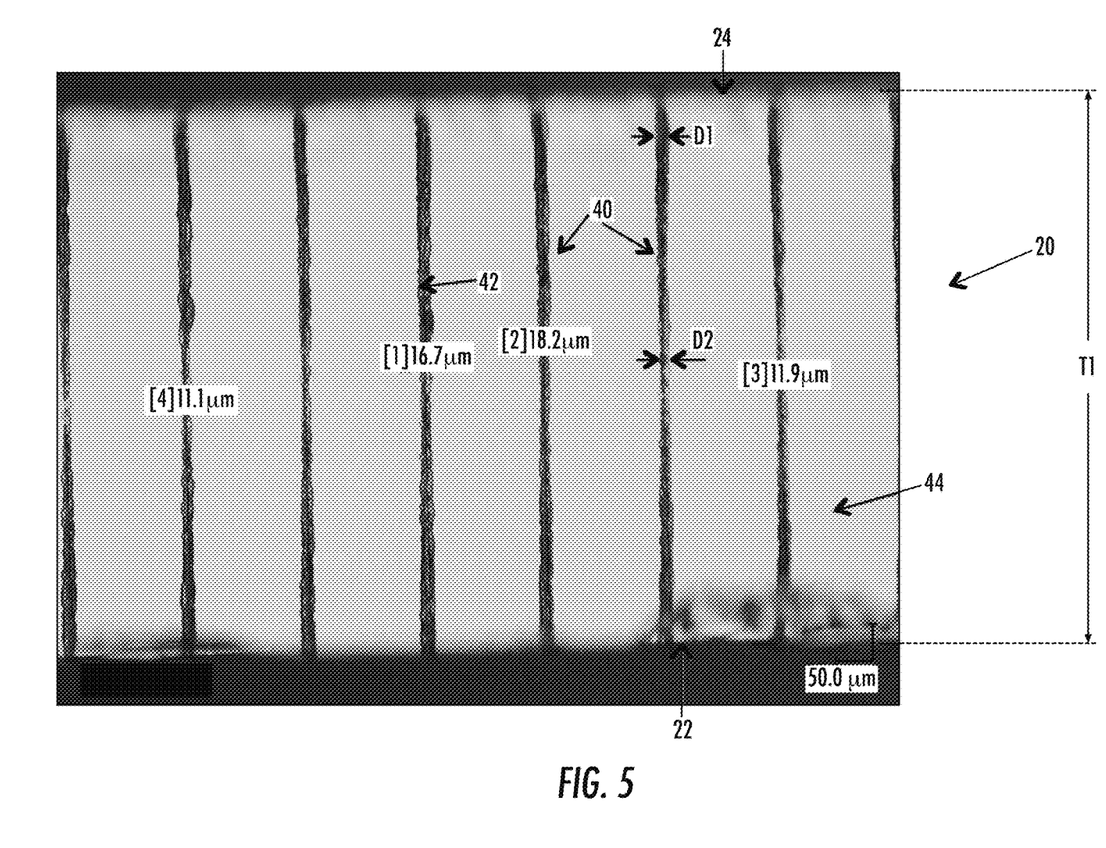
FIG. 5 is an image of a substrate with through vias following etching according to another exemplary embodiment.

Referring to FIG. 5, a detailed view of substrate 20 following etching is shown according to an exemplary embodiment. As shown, following etching, substrate 20 includes a plurality of via, shown as through vias 40, that extend all of the way through substrate 20 between surfaces 22 and 24 and through substrate interior region 44. As noted above, in some embodiments, vias 40 can be through vias, blind vias, or a combination thereof. As shown, through vias 40 have a relatively high aspect ratio (e.g., the ratio of their length and their maximum diameter). In various embodiments, the aspect ratio of vias 40 is greater than 8 to 1, specifically is greater than 10 to 1, and more specifically is greater than 12 to 1. As will be understood, when vias 40 are through vias that extend the entire thickness of substrate 20, the length of through vias 40 is substantial the same as the different thicknesses, T1, discussed herein. As will also be understood, when vias 40 are blind vias, the length of the via will be less than the thickness of the substrate. The length of the via is measured with an interferometer. The diameter of the via is measured by imaging the via with an optical microscope and calculating a least-squares best fit circle to the edges of the via.

In various embodiments, that diameter of vias 40 at various points along its length is large enough to accommodate an electrically conductive material such as a metallizing material such as a metallizing paste but is also small enough to not substantially compromise the integrity or strength of the substrate. In some embodiments, the vias may be filled with an electrically conductive material using any known technique including, but not limited to, sputtering, electroless and/or electrolytic plating, chemical vapor deposition, etc. The electrically conductive material may be, for example, copper, silver, aluminum, titanium, gold, platinum, nickel, tungsten, magnesium, or any other suitable material. In various embodiments, vias 40 have a maximum diameter, shown as D1, that is less than 100 μm and a minimum diameter, shown as D2 that is greater than or equal to 40 μm.

In various embodiments, vias 40 are formed such that their diameter at different points along their length is relatively consistent. In some embodiments, vias 40 do not substantially narrow or taper along their lengths between surfaces 22 and 24, and this structure is the result of the etching rates of the process as discussed herein. In various embodiments, vias 40 are not substantially tapered such that a ratio of D2 to D1 is greater than 0.5. In specific embodiments, through vias 40 are structured such that the ratio of D2 to D1 is between 0.8 and 1, specifically is between 0.9 and 1 and more specifically is between 0.92 and 0.98.

As shown in FIG. 5, vias 40 are defined by an interior surface 42. In various embodiments interior surface 42 has one or more surface characteristics that are different from the surfaces of a hole formed by hydrofluoric acid, by a mechanical drill or by a laser drill. In various embodiments, interior surfaces 42 of vias 40 are substantially smooth, such that interior surfaces 42 have a peak to valley differential of less than 6 μm, and more specifically between 3-6 μm. In various embodiments, interior surfaces 42 of vias 40 are not substantially tapered such that a degree of taper along the length of vias 40 is less than 20%. In various embodiments, interior surfaces 42 are hydroxyl rich surfaces, at least compared to surfaces etched by hydrofluoric acid.

In addition to the structural and etching process improvements discussed herein, substrate 20 may also be tempered to provide increased strength and shatter resistance that is desirable in certain applications, such as in smartphone sensor applications. In various embodiments, substrate 20 is tempered such that regions of the substrate adjacent to surfaces 22 and 24 are under compressive stress and, in some such embodiments, a central region of substrate 20 is under tensile stress. As will be understood, these differential stresses increase the strength and shatter resistance of substrate 20.

In various embodiments, the compressive stress at the surfaces 22 and 24 of substrate 20 is greater 100 MP, and in a specific embodiment is greater than 500 MPa. In one embodiment, substrate 20 may be thermally tempered via a process of heating and rapid cooling. In another embodiment, substrate 20 may be chemically tempered such as through a process of surface ion exchange. As will be understood, chemical tempering swaps small ions, e.g., Na ions, in the substrate near the surface for larger ions, e.g., K ions, and the presence of the larger ions creates a surface compressive stress. In some such embodiments, the compressive stress layers have depths of at least 10 µm from surfaces 22 and 24, and in some such embodiments, the surface compressive stress at each surface is greater than 500 MPa. In at least some embodiments, it is believed that interior surfaces 42 defining vias 40 and the adjacent regions are under compressive stress in addition to the compressive stress formed at surfaces 22 and 24. Such compressive stress may provide strengthening and/or durability to vias 40, in at least some embodiments. Compressive stress at the surface is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety. The depth of the compressive stress layer may be measured by FSM or a scattered light polariscope (SCALP) depending on the ion exchange treatment. Where the stress in the glass-based article is generated by exchanging potassium ions into the glass-based article, FSM is used to measure the depth of the compressive stress layer. Where the stress is generated by exchanging sodium ions into the glass-based article, SCALP is used to measure the depth of the compressive stress layer. Where the stress in the glass-based article is generated by exchanging both potassium and sodium ions into the glass-based article, the depth of the compressive stress layer is measured by SCALP, since it is believed the exchange depth of sodium indicates the depth of the compressive stress layer and the exchange depth of potassium ions indicates a change in the magnitude of the compressive stress (but not the change in stress from compressive to tensile); the exchange depth of potassium ions in such glass-based articles is measured by FSM.

Figure 6:
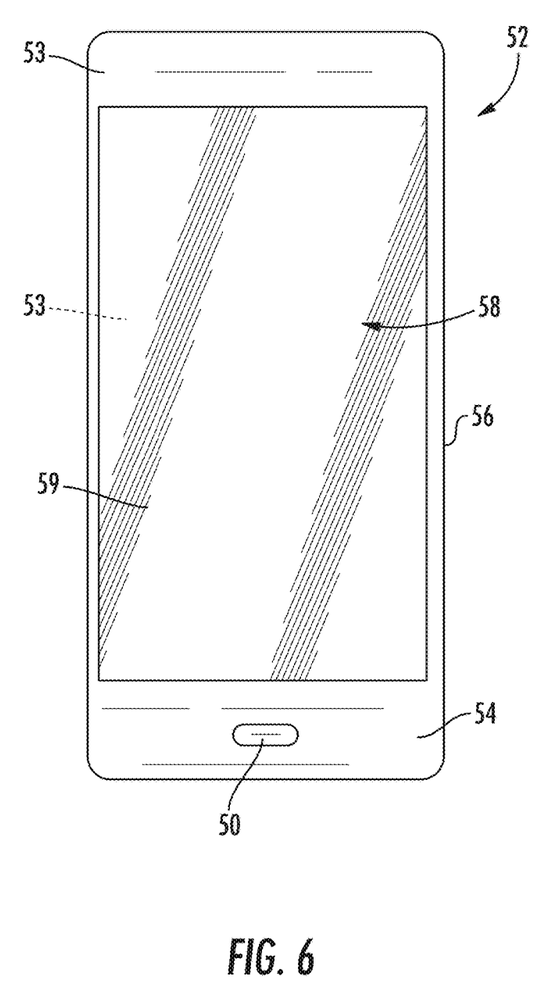
FIG. 6 is shows a device incorporating a sensor substrate in a fingerprint sensor according to an exemplary embodiment.

Substrate 20 as discussed herein may be used for a wide variety of electronics substrate applications, and specifically sensor substrate applications. In a specific embodiment, as shown in FIG. 6, substrate 20 may be used as the substrate for a fingerprint sensor 50, for an electronic device 52 (such as mobile phones, tablets, laptops, computers, navigation systems, and the like). FIG. 6 shows a consumer electronic device 52 including a housing 53 having front 54, back 55, and side surfaces 56; electrical components (not shown) that are at least partially inside or entirely within the housing and including at least a controller, a memory, a fingerprint sensor or touchscreen and a display 58 at or adjacent to the front surface of the housing; and a cover substrate 59 at or over the front surface of the housing such that it is over the display. In specific embodiments, fingerprint sensor 50 includes a metal containing electrically conductive material located within through vias 40 of substrate 20. First and second redistribution layers are located on surfaces 22 and 24, and a capacitance sensing array is coupled to the first redistribution layer. In specific embodiments, a fingerprint sensing ASIC is coupled to the second redistribution layer such that the signals generated by the sensing array are communicated through the substrate and to the ASIC.

In various embodiments, substrate 20 may support a wide variety of additional layers or coatings as desired for a particular application. In a fingerprint sensing embodiment, substrate 20 may support one or more color layers, electrostatic discharge layer and a hard coating layer.

Figure 7:
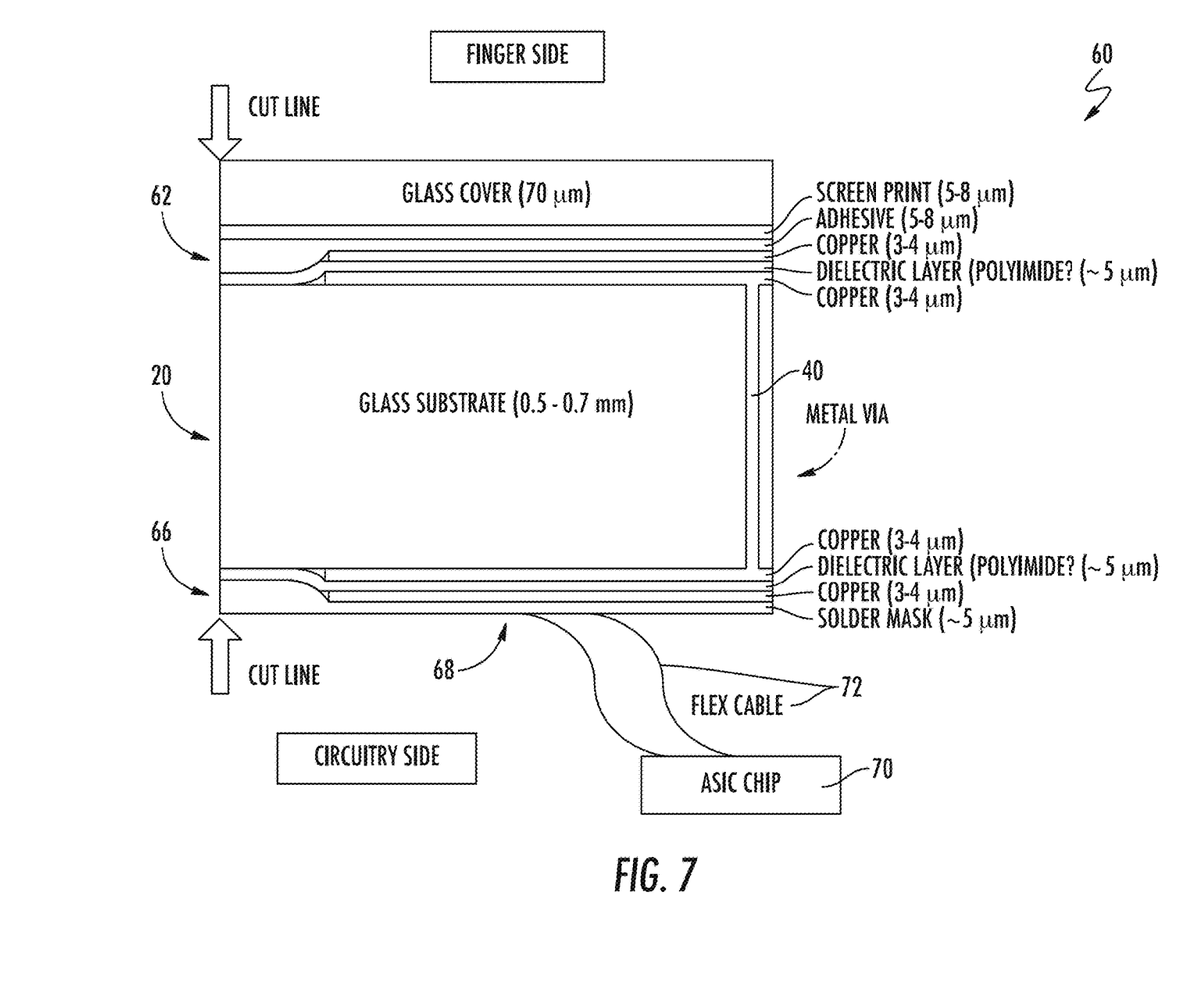
FIG. 7 shows a schematic view of a finger print sensor according to an exemplary embodiment.

An example of a sensor assembly, such as fingerprint sensor 60, is shown according to an exemplary embodiment in FIG. 7. In general, sensor 60 uses a glass-based substrate, such as substrate 20. Various layers 62 are located on a finger side 64 of substrate 20, and various layers 66 are located on a circuit side 68 of substrate 20. Details of layers 62 and 66 are shown in FIG. 7, and a single exemplary metallized through via 40 is shown electrically connecting layers 62 and 66. An ASIC chip 70, configured to process signals related to a sensed finger print is connected via a conductor or cable 72 to layers 66. As discussed above, substrate 20 provides a robust substrate for supporting layers 62 and 66 while at the same allowing for vias 40 to provide conduction between layers 62 and 66.

The substrates and related processes discussed herein provide a number of improvements relative to different sensor substrates, in at least some exemplary embodiments. For example, substrate 20 is believed to be stronger, stiffer and more scratch and crack-resistant than a polymer substrate, and in addition, the strength of substrate 20 allows for use of a thinner hard coating layer on the finger side of the sensor which achieves a better signal-to-noise ratio for the fingerprint sensor. Substrate 20 also is believed to have a lower cost relative to sapphire sensor substrates. Because substrate 20 is formed from a glass-based material it may be tempered (either thermally or chemically), improving the drop performance of the sensor. The high aspect ratio, relatively wide through vias 40 allow for use of low cost metallizing by metal paste application instead of metallizing through extensive vapor deposition or multi-step electrodeposition.

Further, the combination laser damage and hydroxide etching process discussed herein allows for formation of a sensor substrate from a multicomponent glass material (as opposed to pure silica materials such as fused silica). In addition, in at least some embodiments, the process discussed herein avoids the use of hazardous hydrofluoric acid. Further, it is believed that the process discussed herein is more efficient and/or has lower capital costs than a system using mechanical or laser drilling.

Examples

In one exemplary embodiment, damage tracks are initially formed in 0.7 mm thick, 150 mm diameter glass wafers formed of Comp A listed above using the picosecond laser technology described above. The damage pattern is based on the sensor array and/or ASIC of the sensor that the wafer is to be used with. These wafers are then placed in a process carrier with a pitch of 6.4 mm. The process carrier is then immersed in a bath of 6 M sodium hydroxide at 85 degrees C. for 3 days. The carrier is then removed from the alkaline bath and rinsed with large amounts of deionized water. The wafers are subsequently ion-exchanged for 3.5 hours at a temperature of 390 degrees C. using 100% $KNO_3$. This results in a strengthened substrate in which the vias have been opened to an entry diameter of 80 microns and a smallest diameter of 65-75 microns. The remaining sensor components are then patterned onto the substrate using thin film and coating technologies to create the desired product.

In another exemplary embodiment, through vias of eleven micron diameter were formed in 0.7 mm thick sections of Comp A glass by etching in 6 M NaOH at 90 degrees C. for 8 hours. These vias have an aspect ratio of over 60:1 and can subsequently be etched to form vias of a waist ratio greater than 95%. The waist ratio is calculated with respect to the minimum diameter of the via (the "waist") and the maximum diameter of the via.

A first aspect includes process for forming vias in a glass-based substrate having a first major surface and an opposing second major surface, the process comprising creating a plurality of etch paths extending from the first major surface of the glass substrate by directing a laser at the substrate in a predetermined pattern; and etching a plurality of vias extending from the first major surface of the glass substrate along the etch paths using a hydroxide based etching material, wherein the hydroxide based etching material preferentially etches the substrate along the etch path such that an etch rate of the etching material along the etch path is at least 12 times greater than an etch rate of the etching material outside of the etch paths.

A second aspect according to the first aspect, wherein each of the plurality of vias have a ratio of the length of the via to a maximum diameter of the via is greater than 8 to 1.

A third aspect according to the first or second aspects, wherein at least one of the plurality of vias is a through via.

A fourth aspect according to any one of the first through third aspects, wherein at least one of the plurality of vias is a blind via.

A fifth aspect according to any one of the first through fourth aspects, wherein the laser is a picosecond laser.

A sixth aspect according to any one of the first through fifth aspects, wherein the maximum diameter of each of the plurality of vias is less than 100 μm and a ratio of a minimum diameter to the maximum diameter of each of the vias is greater than 0.5

A seventh aspect according to any one of the first through sixth aspects, further comprising filling the plurality of vias with an electrically conductive material.

An eighth aspect according to any one of the first through seventh aspects, wherein the glass-based substrate includes 50-75 mol % SiO2 and 10-20 mol % alkali metal oxide, where the alkali metal oxide is at least one of $Li_2O$, $Na_2O$, $K_2O$, $Rb_2O$ and $Cs_2O$.

A ninth aspect according to any one of the first through eighth aspects, further comprising tempering the glass substrate following etching such that the first major surface and the second major surface are under compressive stress, wherein the compressive stress at one or both of the first and major surfaces is at least 100 MPa.

A tenth aspect according to the ninth aspect, wherein the tempering step comprises chemically tempering the glass substrate through ion exchange such that chemically strengthened layers extend from the first and second major surfaces, wherein a depth of each chemically strengthened layer is greater than 10 μm, and wherein the compressive stress at one or both of the first and major surfaces is at least 500 MPa.

An eleventh aspect according to any one of the first through tenth aspects, wherein the hydroxide based etching material has a hydroxide concentration of at least 0.5 M and is maintained at a temperature of greater than 60 degrees C. during the etching step, and wherein the hydroxide based etching material preferentially etches the substrate along the etch path such that the etch rate of the etching material along the etch path is at least 30 times greater than the etch rate of the etching material outside of the etch paths.

A twelfth aspect according to any one of the first through eleventh aspects, wherein the hydroxide based etching material includes at least one of sodium hydroxide, potassium hydroxide and tetramethylammonium hydroxide in an aqueous mixture with at least one of a diol and an alcohol.

A thirteenth aspect according to any one of the first through twelfth aspects, wherein the glass-based material has an average thickness of greater than 0.3 mm.

A fourteenth aspect according to any one of the first through thirteenth aspects, wherein the glass-based material is glass.

A fifteenth aspect according to any one of the first through thirteenth aspects, wherein the glass-based material a glass-ceramic.

A sixteenth aspect includes a glass-based substrate comprising: a first major surface; a second major surface opposite the first major surface; an interior region located between the first and second major surfaces; and a plurality of vias extending from the first major surface into the interior region, each of the vias having a maximum diameter and a minimum diameter; wherein the substrate has an average thickness of greater than 0.3 mm; wherein the maximum diameter of each of the plurality of vias is less than 100 μm; and wherein a ratio of the minimum diameter to the maximum diameter of each of the vias is greater than 0.5.

A seventeenth aspect according to the sixteenth aspect, wherein the minimum diameter of each of the vias is greater than or equal to 40 μm, and wherein the ratio of the minimum diameter to the maximum diameter of each of the through holes is greater than 0.8 and less than 1.

An eighteenth aspect according to the sixteenth or seventeenth aspect, wherein a ratio of the length of each via to the maximum diameter of each via is greater than 8 to 1.

A nineteenth aspect according to the eighteenth aspect, wherein the length of each via is greater than 0.5 mm and less than 1.1 mm, and wherein the ratio of the length of each via to the maximum diameter of each of via is greater than 10 to 1.

A twentieth aspect according to any one of the sixteenth through nineteenth aspects, wherein the substrate is a includes 50-75 mol % SiO2 and 10-20 mol % alkali metal oxide, where the alkali metal oxide is at least one of $Li_2O$, $Na_2O$, $K_2O$, $Rb_2O$ and $Cs_2O$.

A twenty-first aspect according to any one of the sixteenth through twentieth aspects, wherein the substrate is a tempered glass material wherein the first major surface and the second major surfaces are under compressive stress, and wherein the compressive stress at one or both of the first and second major surfaces is at least 100 MPa.

A twenty-second aspect according to any one of the sixteenth through twenty-first aspects, wherein the substrate is a chemically tempered glass material having chemically strengthened layers extending from the first and second major surfaces, wherein the depths of the chemically strengthened layers are greater than 10 μm, and wherein the compressive stress at one or both of the first and major surfaces is at least 500 MPa.

A twenty-third aspect according to any one of the sixteenth through twenty-second aspects, further comprising: an electrically conductive material located in the vias; a first redistribution layer located on the first major surface; a second redistribution layer located on the second major surface; and a capacitance sensing array coupled to the first redistribution layer.

A twenty-fourth aspect according to any one of the sixteenth through twenty-third aspects, wherein at least one the plurality of vias is a through-via.

A twenty-fifth aspect according to any one of the sixteenth through twenty-fourth aspects, wherein at least one of the plurality of vias is a blind via.

A twenty-sixth aspect including a glass substrate comprising: a first major surface; a second major surface opposite the first major surface; a plurality of through vias extending between the first and second major surfaces, each of the through holes having a maximum diameter and a minimum diameter; and a multicomponent glass material including 50-75 mol % SiO2 and 10-20 mol % alkali metal oxide, where the alkali metal oxide is at least one of $Li_2O$, $Na_2O$, $K_2O$, $Rb_2O$ and $Cs_2O$; wherein the average distance between the first major surface and the second major surface is greater than 0.3 mm; wherein a ratio of the average distance between the first major surface and the second major surface to a maximum diameter of each of the plurality of through vias is greater than 8 to 1; wherein a ratio of the minimum diameter to the maximum diameter of each of the vias is greater than 0.5.

A twenty seventh aspect according to the twenty-sixth aspect, wherein the average distance between the first major surface and the second major surface is greater than 0.5 mm and less than 1.1 mm, wherein the maximum diameter of the through holes is less than 100 μm, and wherein the ratio of the average distance between the first major surface and the second major surface to the maximum diameter of each of the through vias is greater than 10 to 1.

A twenty eighth aspect according to the twenty sixth or twenty seventh aspect, wherein the substrate is a chemically tempered glass material having chemically strengthened layers extending from the first and second major surfaces, wherein a depth of each chemically strengthened layer is greater than 10 μm, and wherein the first major surface and the second major surfaces are under compressive stress and the compressive stress at the surface of one or both of the first and second major surfaces is at least 100 MPa.

A twenty ninth aspect including a consumer electronic product, comprising: a housing having a front surface, a back surface and side surfaces; electrical components provided at least partially within the housing, the electrical components including at least a controller, a memory, a fingerprint sensor, and a display, the display being provided at or adjacent the front surface of the housing; and the glass-based substrate any one of the sixteenth through twenty fifth aspects disposed over the display, wherein the plurality of vias are filled with an electrical conductive material that provides a conductive pathway for the fingerprint sensor.

A thirtieth aspect including a consumer electronic product, comprising: a housing having a front surface, a back surface and side surfaces; electrical components provided at least partially within the housing, the electrical components including at least a controller, a memory, a fingerprint sensor, and a display, the display being provided at or adjacent the front surface of the housing; and the glass substrate of any one of the twenty sixth through twenty eighth aspects disposed over the display, wherein the plurality of through vias are filled with an electrical conductive material that provides a conductive pathway for the fingerprint sensor.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more than one component or element, and is not intended to be construed as meaning only one.

It will be apparent to those skilled in the art that various modifications and variations can be made without departing from the spirit or scope of the disclosed embodiments. Since modifications, combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:

1. A process for forming vias in a glass-based substrate having a first major surface and an opposing second major surface, the process comprising:
    creating a plurality of etch paths extending from the first major surface of the glass substrate by directing a laser at the substrate in a predetermined pattern; and
    etching a plurality of vias extending from the first major surface of the glass substrate along the etch paths using a hydroxide based etching material, wherein the hydroxide based etching material preferentially etches the substrate along the etch path such that an etch rate of the etching material along the etch path is at least 12 times greater than an etch rate of the etching material outside of the etch paths.

2. The process of claim 1, wherein each of the plurality of vias have a ratio of the length of the via to a maximum diameter of the via is greater than 8 to 1.

3. The process of claim 1, wherein at least one of the plurality of vias is a through via.

4. The process of claim 1, wherein at least one of the plurality of vias is a blind via.

5. The process of claim 1, wherein the laser is a picosecond laser.

6. The process of claim 1, wherein the maximum diameter of each of the plurality of vias is less than 100 μm and a ratio of a minimum diameter to the maximum diameter of each of the vias is greater than 0.5.

7. The process of claim 1, further comprising filling the plurality of vias with an electrically conductive material.

8. The process of claim 1, wherein the glass-based substrate includes 50-75 mol % SiO2 and 10-20 mol % alkali metal oxide, where the alkali metal oxide is at least one of $Li_2O$, $Na_2O$, $K_2O$, $Rb_2O$ and $Cs_2O$.

9. The process of claim 8, further comprising tempering the glass-based substrate following etching such that the first major surface and the second major surface are under compressive stress, wherein the compressive stress at one or both of the first and major surfaces is at least 100 MPa.

10. The process of claim 9, wherein the tempering step comprises chemically tempering the glass-based substrate through ion exchange such that chemically strengthened layers extend from the first and second major surfaces, wherein a depth of each chemically strengthened layer is greater than 10 μm, and wherein the compressive stress at one or both of the first and major surfaces is at least 500 MPa.

11. The process of claim 1, wherein the hydroxide based etching material has a hydroxide concentration of at least 0.5 M and is maintained at a temperature of greater than 60 degrees C. during the etching step, and wherein the hydroxide based etching material preferentially etches the substrate along the etch path such that the etch rate of the etching material along the etch path is at least 30 times greater than the etch rate of the etching material outside of the etch paths.

12. The process of claim 11, wherein the hydroxide based etching material includes at least one of sodium hydroxide, potassium hydroxide and tetramethylammonium hydroxide in an aqueous mixture with at least one of a diol and an alcohol.

13. The process of claim 1, wherein the glass-based material has an average thickness of greater than 0.3 mm.

14. The process of claim 1, wherein the glass-based material is glass.

15. The process of claim 1, wherein the glass-based material a glass-ceramic.

* * * * *

UNITED STATES PATENT AND TRADEMARK OFFICE
CERTIFICATE OF CORRECTION

PATENT NO. : 10,438,039 B2
APPLICATION NO. : 16/131247
DATED : October 8, 2019
INVENTOR(S) : Yuhui Jin et al.

Page 1 of 1

It is certified that error appears in the above-identified patent and that said Letters Patent is hereby corrected as shown below:

On page 2, in Column 2, item (56), Other Publications, Line 2, delete "Femotosecond" and insert -- Femtosecond --, therefor.

In Column 14, Line 39, Claim 8, delete "SiO2" and insert -- $SiO_2$ --, therefor.

Signed and Sealed this
Twenty-fifth Day of February, 2020

Andrei Iancu
*Director of the United States Patent and Trademark Office*